(12) United States Patent
Lee et al.

(10) Patent No.: US 6,908,819 B2
(45) Date of Patent: Jun. 21, 2005

(54) METHOD OF FABRICATING FLAT-CELL MASK READ-ONLY MEMORY DEVICES

(75) Inventors: Hee-Jueng Lee, Gyeonggi-do (KR); Myung-Ho Ko, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/360,881

(22) Filed: Feb. 7, 2003

(65) Prior Publication Data

US 2003/0153153 A1 Aug. 14, 2003

(30) Foreign Application Priority Data

Feb. 8, 2002 (KR) .................... 10-2002-0007295

(51) Int. Cl.⁷ .......................................... H01L 21/8246
(52) U.S. Cl. ...................................... 438/275; 438/278
(58) Field of Search ............................... 438/275–279

(56) References Cited

U.S. PATENT DOCUMENTS

| 5,710,067 A | * | 1/1998 | Foote et al. | ............. | 438/636 |
| 6,500,768 B1 | * | 12/2002 | Shields et al. | ............. | 438/738 |
| 2002/0173102 A1 | * | 11/2002 | Lee et al. | ............. | 438/275 |
| 2003/0129794 A1 | * | 7/2003 | Liu | ............. | 438/200 |

FOREIGN PATENT DOCUMENTS

| KR | 1997-0079128 | 12/1997 |
| KR | 2000-13931 | 3/2000 |

OTHER PUBLICATIONS

English language of Abstract for Korean Patent Publication No. 2000–13931.
English language of Abstract for Korean Publication No. 1997–0079128.

* cited by examiner

Primary Examiner—H. Jey Tsai
(74) Attorney, Agent, or Firm—Marger Johnson & McCollom, P.C.

(57) ABSTRACT

According to embodiments of the invention, a first gate insulating pattern and a mask pattern are sequentially stacked on a semiconductor substrate. Subsequently an impurity region is formed in the semiconductor substrate. Next, the mask pattern is removed to expose the first gate insulating pattern and a second gate insulating layer is formed on the entire surface thereof. The mask pattern is preferably formed of an anti-reflecting pattern and a photoresist pattern that are sequentially stacked. The anti-reflecting pattern is preferably formed of a material layer without etching selectivity with respect to the photoresist pattern. For this, the anti-reflecting pattern is preferably formed of organic materials including hydrocarbonic compounds. In addition, removing a mask pattern is performed with an etch recipe having an etch selectivity with respect to the first gate insulating pattern.

15 Claims, 3 Drawing Sheets

METHOD OF FABRICATING FLAT-CELL MASK READ-ONLY MEMORY DEVICES

CROSS REFERENCE TO RELATED APPLICATIONS

This application claims priority under 35 USC § 119 to Korean Patent Application 2002-7295, filed on Feb. 8, 2002, the contents of which are hereby incorporated by reference in their entirety for all purposes.

BACKGROUND OF THE INVENTION

1. Field of the Invention

The present invention generally relates to a method of fabricating a semiconductor device and, more specifically, to a method of fabricating flat-cell mask read-only memory (ROM) devices.

2. Background of the Invention

Mask read-only memories (MROMs) are categorized as either NAND-type ROMs or NOR-type ROMs. Operating speed of the NAND-type ROMs is low, while operating speed of the NOR-type ROMs high. Cell areas of the NAND-type ROMs are small, while cell areas of the NOR-type ROMs are large. Thus, NAND-type ROMs are advantageous in achieving a high integration level but the NOR-type ROMs are not. A flat NOR-type ROM has been proposed, which has both the advantages of the NAND-type ROMs and the NOR-type ROMs (i.e., high operating speed and small cell area). The flat NOR-type ROM is a kind of mask ROM that does not have a isolating layer or a contact in a unit cell and uses a buried impurity region formed in the semiconductor substrate as a bit line.

FIGS. 1 through 3 are cross-sectional views showing steps for fabricating a flat NOR-type ROM semiconductor device in accordance with the prior art.

Referring to FIG. 1, a buffer oxide layer 20, an anti-reflecting layer 30, and a photoresist layer (not shown) are sequentially formed on a substrate 10. Using conventional photolithographic processes, the photoresist layer is patterned to form photoresist patterns 40 exposing top surfaces of the anti-reflecting layer 30 at predetermined regions. In this case, the anti-reflecting layer 30 is a material layer for the convenience of the photolithographic process that forms the photoresist patterns 40. Generally, the anti-reflecting layer 30 is made of a silicon oxynitride (SiON).

Using the photoresist patterns 40 as ion implantation masks, an ion implantation process is performed to form impurity regions 50 on the semiconductor substrate 10. The ion implantation process implants arsenic (As) ions into the semiconductor substrate 10 through the anti-reflecting layer 30 and the buffer oxide layer 20. In this case, silicon atoms of the semiconductor substrate 10 depart from the lattice structure because of the kinetic energy of the arsenic ions. Thus, lattice defects are found in the impurity regions 50.

Referring to FIG. 2, after forming the impurity regions 50, the photoresist patterns 40 are removed to expose the anti-reflecting layer 30. Afterward, using etchant containing phosphoric acid ($H_3PO_4$), the exposed anti-reflecting layer 30 is removed.

Etching the anti-reflecting layer 30 with phosphoric acid harms the buffer oxide layer 20 lying underneath, causing etching damages. Specifically, the thickness variation of the buffer oxide layer 20 increases, causing its physical/electrical properties to degrade. Thus, the buffer oxide layer 20 may not be used as a gate insulating layer of the transistor and is usually eliminated by etchant containing fluoric acid. As a result, an entire top surface of the semiconductor substrate 10 is exposed.

Referring to FIG. 3, gate insulating layers 60 and 65 are formed on the entire surface of the semiconductor substrate after the buffer oxide layer 20 is removed. The gate insulating layers 60 and 65 are important material layers for defining characteristics of a MOS transistor and are preferably formed by a thermal process in order to achieve good operating characteristics.

The thermal process is normally performed at a temperature of about 850° C. The high temperature thermal process causes the impurities in the impurity regions 50 to diffuse. Therefore, buried impurity regions 55 are formed that are wider and deeper than the former impurity regions 50. Each of the buried impurity regions 55 acts as a source/drain of a flat NOR-type ROM and an interconnection for connecting the same.

Meanwhile, to achieve stable properties of a MOS transistor, the gate insulating layers 60 and 65 must be formed to a predetermined thickness ($t_{OX}$) or more. As shown in FIG. 2, the buffer oxide layer 20 is removed when the anti-reflecting layer 30 is removed, fully exposing the top surface of the semiconductor substrate 10. Thus, the processing time increases and the impurities (i.e., As) in the impurity regions 50 are more widely diffused. At this stage additional processing time is needed to perform thermal processes for forming the gate insulating layer 60 to a thickness of $t_{OX}$. Moreover, when the top surfaces of the impurity regions 50 are exposed, impurities therein are actively diffused in a horizontal direction. The prior art suffers from a short channel effect as a distance l1 between the buried impurity regions 55 becomes close. The short channel effect is a serious factor that prevents the high integration of semiconductor devices.

In the thermal process, the impurity regions 50 with lattice defects react to oxygen more actively than the impurity regions without lattice defects. Therefore, gate insulating layers 65 of the impurity regions 50 are thicker than gate insulating layers 60 of regions without implanted impurities.

In addition, a gate electrode 70 is formed on the semiconductor substrate 10 including the gate insulating layers 60 and 65. The gate electrodes 70 are preferably formed to cross over the buried impurity regions 55.

SUMMARY OF THE INVENTION

In view of high integration of semiconductor devices, there is need in the art for a method of fabricating a mask ROM device to prevent short channel effect.

Accordingly, it is a feature of the present invention to provide a method of fabricating mask ROM device including steps of sequentially forming a first gate insulating pattern, an impurity region and a second gate insulating layer. According to the method, a first gate insulating pattern and a mask pattern,which are sequentially stacked on a semiconductor substrate, are formed to expose a predetermined region of the semiconductor substrate and then an impurity region is formed in the exposed semiconductor substrate. Continuously, the mask pattern is removed to expose the first gate insulating pattern. Afterward, a second gate insulating layer is formed on the entire surface of the semiconductor substrate with the first gate insulating pattern exposed.

The mask pattern is preferably formed of an anti-reflecting pattern and a photoresist pattern which are sequentially stacked. The anti-reflecting pattern is preferably formed of a material layer without etch selectivity with respect to the photoresist pattern in order to be removed without addition process, during a removal of the photoresist pattern. For this, the anti-reflecting pattern is perferably formed of organic materials including hydrocarbonic compounds.

Moreover, removing the mask pattern is preferably performed with etch recipe having etch selectivity with respect to the first gate insulating pattern.

Preferably, the first gate insulating pattern is formed to a thickness of 10–200 Å and the second gate insulating layer is formed to a thickness of 10–300 Å. Particularly, the second gate insulating layer is preferably formed by thermal oxidation process. The second gate insulating layer on the impurity region may be thicker than that on the first gate insulating pattern. The impurity region is preferably formed to have an impurity concentration of at lease $10^{18}$ atoms/cm$^3$.

DETAILED DESCRIPTION OF THE INVENTION

Figure 1:
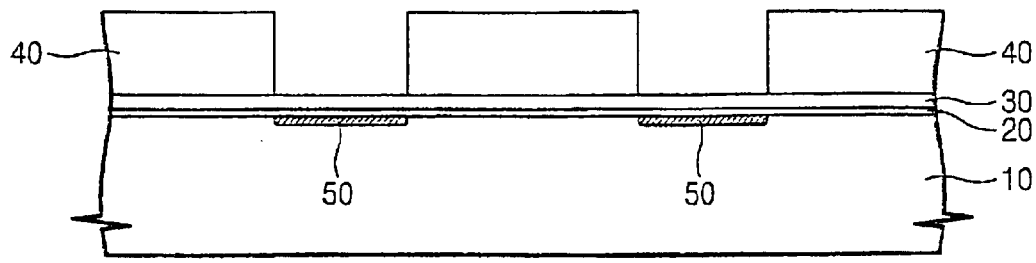
FIGS. 1 through 3 are cross-sectional views showing a method of fabricating a mask ROM semiconductor device in accordance with the prior art.
Figure 2:
Figure 3:
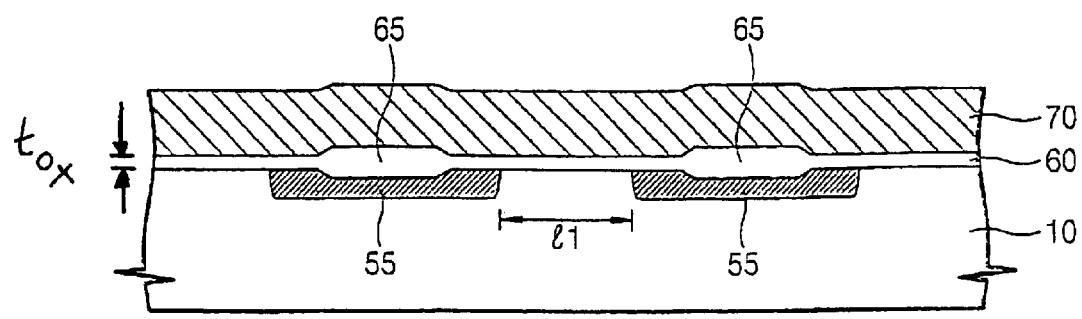

The invention will be described more fully hereinafter with reference to the accompanying drawings, in which preferred embodiments of the invention are shown. This invention, however, is embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIGS. 4 through 7 are cross-sectional views showing steps of fabricating a mask ROM semiconductor device in accordance with an embodiment of the present invention.

Figure 4:
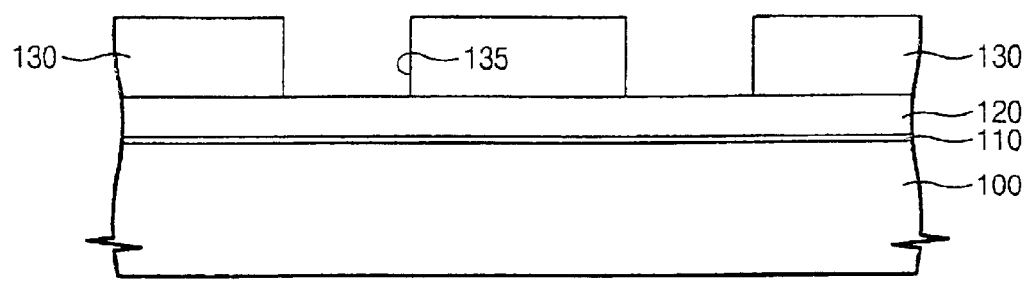
FIGS. 4 through 7 are cross-sectional views showing a method of fabricating a mask ROM semiconductor device in accordance with an embodiment of the invention.

Referring to FIG. 4, an isolating layer (not shown) is formed in a predetermined region of a semiconductor substrate 100. A first gate insulating layer 110, an anti-reflecting layer 120 and a photoresist layer (not shown) are sequentially formed on the entire surface of the semiconductor substrate 100 including the isolating layer. Using conventional photolithographic process, the photoresist layer is patterned to form photoresist patterns 130 having a plurality of openings 135 which expose the anti-reflecting layer 120. In this case, the openings 135 serve to define a buried impurity region of a flat-cell ROM for subsequent processes. Thus, the openings 135 are preferably in a parallel line.

The first gate insulating layer 110 is preferably a silicon oxide layer or a silicon oxynitride layer that are formed through thermal processes. When the first gate insulating layer 110 is formed, the thermal process is preferably carried out at a temperature of about 850° C. In addition, the first gate insulating layer 110 is formed with consideration to a recessed thickness during a subsequent process for removing the anti-reflecting layer 120 and is preferably formed to a thickness of 10–200 Å.

The anti-reflecting layer 120 is formed of a material layer that can be etched during removal of the photoresist patterns 130 and does not require additional etching. The anti-reflecting layer 120 is preferably formed of a material layer having etch selectivity with respect to the first gate insulating layer 110. The anti-reflecting layer 120 is preferably organic material including a hydrocarbonic compound. According to the prior art, since a silicon oxynitride layer is used as the anti-reflecting layer, particle defects may occur. However, according to this embodiment, since the anti-reflecting layer is formed of an organic material, the particle defects are reduced.

Figure 5:
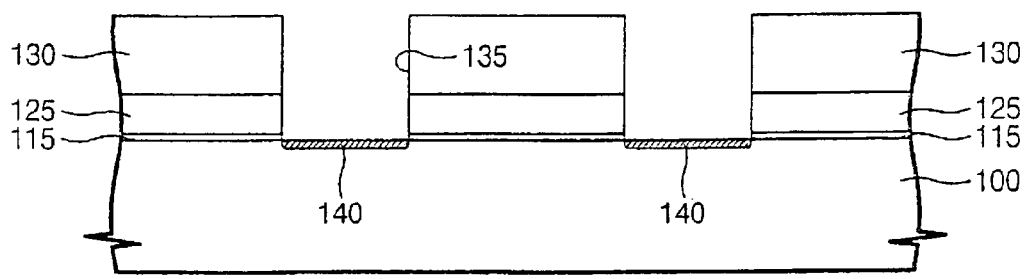

Referring to FIG. 5, using the photoresist patterns 130 as an etching mask, the anti-reflecting layer 120 and the first gate insulating layer 110 are successively patterned. Therefore, anti-reflecting patterns 125 and first gate insulating patterns 115 are formed to expose top surfaces of the semiconductor substrate 100 under the openings 135. Next, ion implantation processes are performed using the photoresist patterns 130 and the anti-reflecting patterns 125 as mask patterns, thereby forming impurity regions 140 at the exposed top surfaces of the semiconductor substrate 100.

The etching process for forming the anti-reflecting patterns 125 and the first gate insulating patterns 115 is performed anisotropically. Moreover, the etching process for forming the first gate insulating patterns 115 is carried out with an etch recipe that has an etch selectivity with respect to the semiconductor substrate 100.

The ion implantation process for forming the impurity regions 140 is preferably performed using arsenic (As) ions as impurities. Ion channeling may be caused by the ion implantation process, since ion impurities are injected into the exposed semiconductor substrate 100. In order to minimize the ion channeling, ion impurities are preferably implanted at an angle of approximately 7–11 degrees. Each of the impurity regions 140 acts as a source/drain of a flat-cell mask ROM and an interconnection for interconnecting the same. Therefore, the impurity regions 140 must have a low resistance. To achieve this, ion impurities are preferably implanted at a dose of at least $10^{14}$ atoms/cm$^2$ during the ion implantation process. Silicon atoms in the impurity regions 140 depart from the lattice structures during the ion implantation process, causing lattice defects to occur in the impurity regions 140.

As compared to the prior art process that uses a buffer layer, the ion implantation process requires less energy because the semiconductor substrate 100 is exposed. Thus, horizontal diffusion of the impurity regions 140 is reduced and the short channel effect is minimized.

Figure 6:
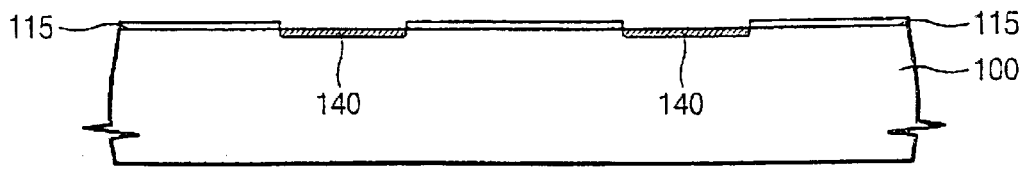

Referring to FIG. 6, the photoresist patterns 130 (FIG. 5) and the anti-reflecting patterns 125 (FIG. 5) are removed to expose the first gate insulating patterns 115.

Preferably, removing the photoresist patterns 130 and the anti-reflecting patterns 125 is done using an etch recipe that has an etch selectivity with respect to the first gate insulating patterns 115. However, the etching process for removing the anti-reflecting patterns 125 normally does not have complete etch selectivity with respect to the first gate insulating patterns 115. Thus, portions of the first gate insulating patterns 115 may be recessed during the etching process for removing the anti-reflecting patterns 125. Moreover, after removing the anti-reflecting patterns 125, a cleaning process is preferably applied. The cleaning process also recesses the first gate insulating patterns 115. The initial thickness of the first gate insulating patterns 115 is preferably determined with consideration of these later recessing processes.

Figure 7:
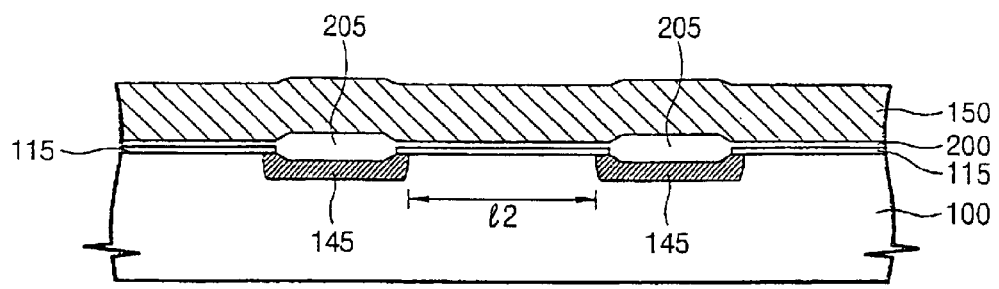

Referring to FIG. 7, second gate insulating layers 200 and 205 are formed on the entire surface of the semiconductor substrate 100 where the first gate insulating patterns 115 are exposed. The second gate insulating layers 200 and 205 are preferably a silicon oxide layer or a silicon oxynitride layer, which are formed by a thermal process.

Because of the thermal process, the second gate insulating layers 205 that lie upon the impurity regions are thicker than the second gate insulating layers 200 that lie upon the first gate insulating patterns 115.

In addition, the thermal process for forming the second gate insulating layers 200 and 205 cures lattice defects in the impurity regions 140 (FIG. 6) and simultaneously causes the impurities therein to diffuse. Therefore, the impurity regions 140 become wider and deeper and form buried impurity regions 145 covered by the first gate insulating patterns 115 and the second gate insulating layers 200 and 205. As explained above, each of the buried impurity regions 145 acts as a source/drain of a flat-cell mask ROM and an interconnection for interconnecting the same.

Meanwhile, according to this embodiment of the invention, the thermal process for forming the buried impurity regions 145 is carried out while the semiconductor substrate 100 is covered by the first gate insulating patterns 115. Thus, excessive horizontal diffusion of the impurities in the impurity regions 140 is prevented.

According to the prior art, since a gate insulating layer is not present on the semiconductor substrate before the thermal process begins, the processing time required by the thermal process, which causes impurities to be diffused, increases. According to this embodiment, the first gate insulating patterns 115 are already formed where a gate insulating layer for a MOS transistor is to be formed. Therefore, the processing time required by the thermal process is reduced, the over-diffusion of impurities is reduced, and the short channel effect is minimized. That is, a length l2 between the buried impurity regions 145 (the channel length) is longer than the channel length l1 of the prior art.

A gate conductive layer (not shown) is stacked on an entire surface of a semiconductor substrate having the second gate insulating layers 200 and 205. The gate conductive layer is preferably a multiple layer that includes a polysilicon layer and a silicide layer, which are sequentially stacked. Subsequently, the gate conductive layer is patterned to form a gate electrode 150 exposing the top surfaces of the second gate insulating layers 200 and 205. In this case, the gate electrode 150 is preferably patterned to cross over the buried impurity regions 145. Afterward, using a conventional method, an interlayer dielectric and a metal interconnection (not shown) are additionally formed on the semiconductor substrate 100 including the gate electrode 150.

Figure 8:
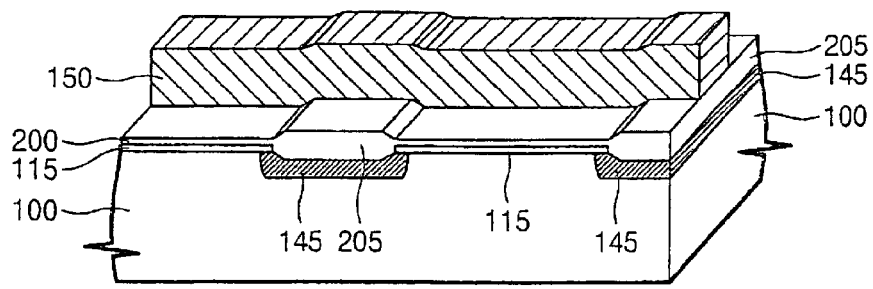
FIG. 8 is a perspective view showing a mask ROM semiconductor device in accordance with another embodiment of the invention.

FIG. 8 is a perspective view showing the flat-cell ROM semiconductor device fabricated by the methods illustrated in FIGS. 4 through 7.

Referring to FIG. 8, a plurality of buried impurity regions 145 are disposed at a predetermined region of a semiconductor substrate 100. Preferably, the buried impurity regions 145 are disposed parallel to each other. In addition, the buried impurity regions 145 preferably have an impurity concentration of at least $10^{18}$ atoms/cm$^3$ and the impurities are preferably arsenic (As) atoms. Therefore, each of the buried impurity regions 145 has a low resistance and acts as a source/drain of a flat-cell ROM and as an interconnection for interconnecting the same.

A plurality of gate electrodes 150 are disposed on the substrate 100 including the buried impurity regions 145 to cross over the gate electrodes 150. The gate electrodes 150 are preferably disposed in parallel to each other. In addition, each of the gate electrodes 150 is a multiple layer that includes a polysilicon layer and a silicide layer which are sequentially stacked. An anti-reflecting layer (not shown) may also be disposed on the gate electrodes 150.

A gate insulating layer is disposed between the semiconductor substrate 100 and the anti-reflecting patterns 125. In this case, the gate insulating layer includes the first gate insulating patterns 115 and second insulating layers 200 and 205. The first gate insulating patterns 115 cover the substrate 100 between adjacent buried impurity regions 145. The second gate insulating layers 200 and 205 cover the first gate insulating patterns 115 and the buried impurity regions 145. The second gate insulating layers 205 covering the buried regions 145 are thicker than the second gate insulating layers 200 covering the first gate insulating patterns 115. The first gate insulating patterns 115 and the second gate insulating layers 200 are preferably formed of a silicon oxide, for example, silicon oxynitride.

According to the embodiment, a first gate insulating pattern is initially formed, followed by an impurity region and then a second gate insulating layer. Therefore, the processing time required by a thermal process that forms the second gate insulating layer is reduced, minimizing the extension of the impurity region. According to the prior art, impurities in the impurity region are excessively diffused in an exposed semiconductor substrate during the thermal process that forms the second gate insulating layer. However, a first gate insulating pattern covering the semiconductor substrate can minimize the excessive diffusion of impurities. As a result, the short channel effect is minimized and highly integrated flat-cell mask ROMs may be fabricated.

What is claimed is:

1. A method of fabricating a flat-cell mask ROM device comprising:

forming a first gate insulating pattern, an anti-reflecting pattern, and a photoresist pattern that are sequentially stacked on a semiconductor substrate and that expose a predetermined region of the semiconductor substrate, the anti-reflecting pattern formed of organic materials including a hydrocarbonic compound;

forming an impurity region in the predetermined region of the semiconductor substrate;

simultaneously removing the anti-reflecting pattern and the photoresist pattern to expose the first gate insulating pattern; and forming a second gate insulating layer on an entire surface of the semiconductor substrate.

2. The method of claim 1, wherein forming the first gate insulating pattern comprises forming the first gate insulating patter to a thickness of 10–200 Å.

3. The method of claim 1, wherein removing the anti-reflecting pattern and the photoresist pattern comprises using an etch recipe having an etch selectivity with respect to the first gate insulating pattern.

4. The method of claim 1, wherein forming the second gate insulating layer comprises using a thermal oxidation process.

5. The method of claim 1, wherein forming the second gate insulating layer comprises forming the second gate insulating layer to a thickness of approximately 10–300 Å.

6. A method of fabricating a flat-cell mask ROM device comprising:

sequentially forming a first gate insulating layer, an anti-reflecting layer, and a photoresist pattern on a semiconductor substrate, the anti-reflecting layer formed of organic materials including a hydrocarbonic compound;

successively etching the anti-reflecting layer and the first gate insulating layer using the photoresist pattern as an etching mask, thereby forming a first gate insulating pattern and an anti-reflecting pattern that expose a predetermined region of the semiconductor substrate;

performing an ion implantation process using the photoresist pattern as an ion implantation mask, thereby forming an impurity region in the predetermined region of the semiconductor substrate;

exposing the first gate insulating pattern after the impurity region is formed by simultaneously removing the photoresist pattern and the anti-reflective pattern; and forming a second gate insulating layer on an entire surface of the semiconductor substrate.

7. The method of claim 6, wherein forming the first gate insulating layer comprises thermally oxidizing the semiconductor substrate.

8. The method of claim 6, wherein forming the first gate insulating layer comprises forming the first gate insulating layer to a thickness of 10–200 Å.

9. The method of claim 6, wherein forming the anti-reflecting layer comprises forming a material layer having a low etch selectivity with respect to the photoresist pattern.

10. The method of claim 6, wherein forming the first gate insulating pattern comprises using an etch recipe having an etch selectivity with respect to the semiconductor substrate.

11. The method of claim 6, wherein the impurity region has an impurity concentration of at least $10^{18}$ atoms/cm$^3$.

12. The method of claim 6, wherein removing the photoresist pattern and the anti-reflecting pattern comprises using an etch recipe having an etch selectivity with respect to the first gate insulating pattern.

13. The method of claim 6, wherein forming the second gate insulating layer comprises thermally oxidizing the semiconductor substrate with the first gate insulating pattern exposed.

14. The method of claim 6, wherein forming the second gate insulating layer comprises forming the second gate insulating layer thicker where it lies directly on the impurity region than where it lies directly on the first gate insulating pattern.

15. The method of claim 6, wherein forming the second gate insulating layer comprises forming the second gate insulating layer to a thickness of approximately 10–300 Å.

* * * * *

UNITED STATES PATENT AND TRADEMARK OFFICE
CERTIFICATE OF CORRECTION

PATENT NO. : 6,908,819 B2  
APPLICATION NO. : 10/360881  
DATED : June 21, 2005  
INVENTOR(S) : Lee et al.

It is certified that error appears in the above-identified patent and that said Letters Patent is hereby corrected as shown below:

On the Title page, Section (30) Foreign Application Priority Data, please replace "10-2002-0007295" with --2002-07295--

At column 2, line 32, please replace "distance 11 between" with --distance $\ell 1$--At column 5, line 42, please replace "length 12 between" with --length $\ell 2$ between--

At column 5, line 43, please replace "length 11 of" with --length $\ell 1$ of--

Signed and Sealed this

Second Day of January, 2007

JON W. DUDAS  
*Director of the United States Patent and Trademark Office*